US010153426B2

(12) United States Patent
Seino et al.

(10) Patent No.: US 10,153,426 B2
(45) Date of Patent: Dec. 11, 2018

(54) MANUFACTURING METHOD OF MAGNETORESISTIVE EFFECT ELEMENT

(71) Applicant: CANON ANELVA CORPORATION, Kawasaki-shi (JP)

(72) Inventors: Takuya Seino, Kawasaki (JP); Yuichi Otani, Kawasaki (JP); Kazumasa Nishimura, Kawasaki (JP)

(73) Assignee: CANON ANELVA CORPORATION, Kawasaki-shi (JP)

( * ) Notice: Subject to any disclaimer, the term of this patent is extended or adjusted under 35 U.S.C. 154(b) by 0 days.

(21) Appl. No.: 15/134,840

(22) Filed: Apr. 21, 2016

(65) Prior Publication Data

US 2016/0240772 A1 Aug. 18, 2016

Related U.S. Application Data

(63) Continuation of application No. PCT/JP2014/005682, filed on Nov. 12, 2014.

(30) Foreign Application Priority Data

Nov. 18, 2013 (JP) .................. 2013-237543
Apr. 14, 2014 (JP) .................. 2014-082914
Jun. 24, 2014 (JP) .................. 2014-128811

(51) Int. Cl.
*H01L 27/22* (2006.01)
*H01L 43/12* (2006.01)
(Continued)

(52) U.S. Cl.
CPC ........... *H01L 43/12* (2013.01); *H01F 41/302* (2013.01); *H01L 21/67109* (2013.01);
(Continued)

(58) Field of Classification Search
CPC ...................................... H01L 27/22
See application file for complete search history.

(56) References Cited

U.S. PATENT DOCUMENTS 8,098,514 B2   1/2012   Nagase et al.
8,728,830 B2   5/2014   Nishimura
(Continued)

FOREIGN PATENT DOCUMENTS

JP   2005-203702 A   7/2005
JP   2006-286669 A   10/2006
(Continued)

OTHER PUBLICATIONS

International Search Report in International Application No. PCT/JP2014/005682 (dated Feb. 3, 2015).
(Continued)

*Primary Examiner* — Joseph C Nicely
*Assistant Examiner* — Lamont Koo
(74) *Attorney, Agent, or Firm* — Venable LLP

(57) ABSTRACT

This invention provides a manufacturing method of a magnetoresistive effect element having a higher MR ratio than a conventional element. A manufacturing method of a magnetoresistive effect element of an embodiment of the invention includes: a step of forming a tunnel barrier layer on a substrate, on a surface of which one of a magnetization free layer and a magnetization fixed layer is formed; a step of cooling the substrate after the step of forming a tunnel barrier layer; a step of forming an other one of the magnetization free layer and the magnetization fixed layer on the tunnel barrier layer after the step of cooling; and a step of raising a temperature of the substrate after the step of forming the other one of the magnetization free layer and the magnetization fixed layer.

2 Claims, 5 Drawing Sheets

(51) Int. Cl.
  *H01L 21/67* (2006.01)
  *H01L 21/687* (2006.01)
  *H01F 41/30* (2006.01)
  *H01F 10/12* (2006.01)
  *H01F 10/32* (2006.01)

(52) U.S. Cl.
  CPC ...... *H01L 21/68742* (2013.01); *H01L 27/222* (2013.01); *H01F 10/123* (2013.01); *H01F 10/3286* (2013.01)

(56) References Cited

U.S. PATENT DOCUMENTS

| | | | | |
|---|---|---|---|---|
| 2008/0088980 | A1* | 4/2008 | Kitagawa | B82Y 25/00 360/313 |
| 2008/0246104 | A1* | 10/2008 | Ranjan | G11C 11/5607 257/421 |
| 2010/0078310 | A1* | 4/2010 | Tsunekawa | B82Y 25/00 204/192.2 |
| 2011/0081732 | A1* | 4/2011 | Choi | B82Y 10/00 438/3 |
| 2012/0288963 | A1* | 11/2012 | Nishimura | B82Y 10/00 438/3 |
| 2013/0288398 | A1* | 10/2013 | Yamamoto | H01L 43/08 438/3 |
| 2014/0004387 | A1* | 1/2014 | Inturi | G11B 5/1278 428/826 |
| 2016/0005958 | A1 | 1/2016 | Seino et al. | |

FOREIGN PATENT DOCUMENTS

| | | |
|---|---|---|
| JP | 2009-081315 A | 4/2009 |
| JP | 2011-054238 A | 3/2011 |
| WO | 2011/081203 A1 | 7/2011 |
| WO | 2014/097510 A1 | 6/2014 |
| WO | 2015/072140 A1 | 5/2015 |

OTHER PUBLICATIONS

D. C. Worledge et al., "Spin Torque Switching of Perpendicular Ta|CoFeB|MgO-Based Magnetic Tunnel Junctions," 98 (2) Appl. Phys. Lett. 022501-1-022501-3 (Jan. 2011).

Erratum: "Spin Torque Switching of Perpendicular Ta|CoFeB|MgO-Based Magnetic Tunnel Junctions," 108 Appl. Phys. Lett. 139901-1 (Mar. 2016).

* cited by examiner

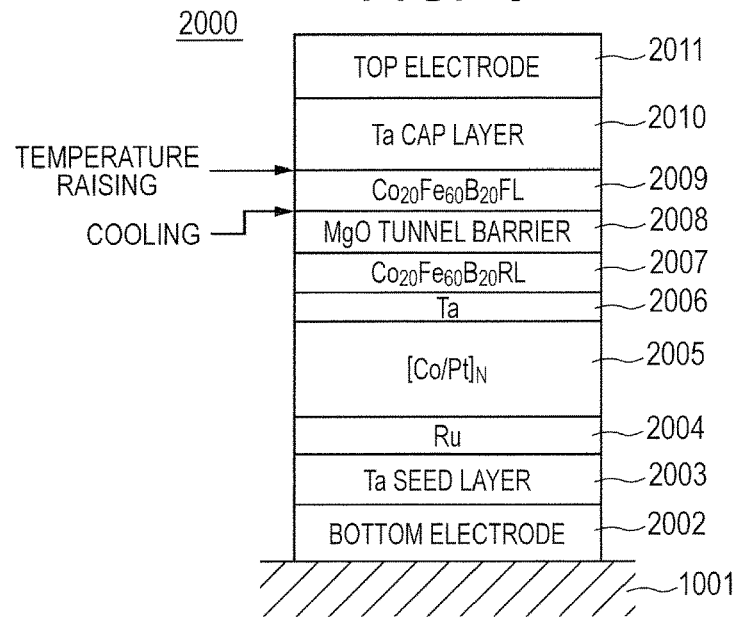
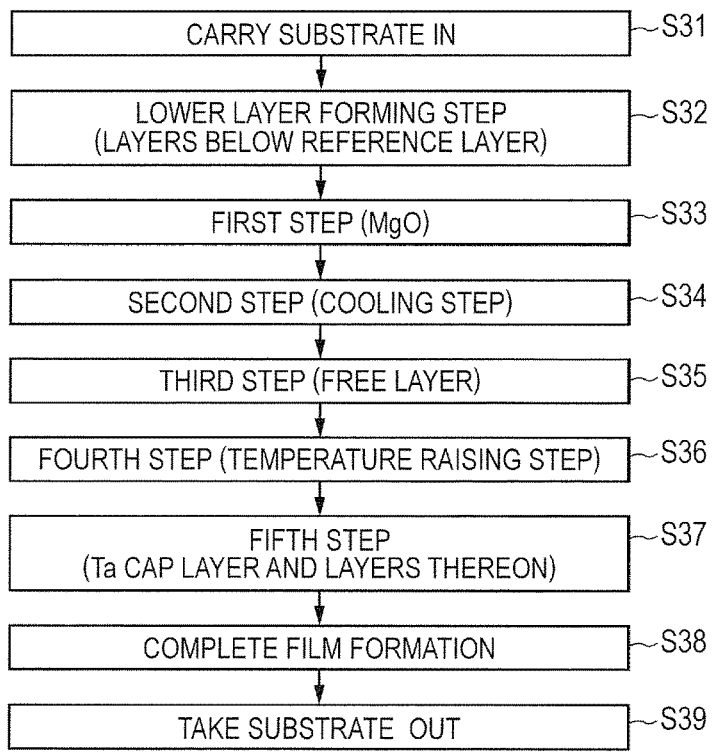

MANUFACTURING METHOD OF MAGNETORESISTIVE EFFECT ELEMENT

CROSS-REFERENCES TO RELATED APPLICATIONS

This application is a continuation application of International Application No. PCT/JP2014/005682, filed Nov. 12, 2014, which claims the benefit of Japanese Patent Application Nos. 2013-237543 filed Nov. 18, 2013, 2014-082914 filed Apr. 14, 2014 and 2014-128811 filed Jun. 24, 2014. The contents of the aforementioned applications are incorporated herein by reference in their entireties.

TECHNICAL FIELD

The present invention relates to a manufacturing method of a magnetoresistive effect element, or more specifically, to a manufacturing method suitable for a TMR element used in an MRAM.

BACKGROUND ART

As a magnetoresistive effect element which changes its electric resistance depending on a magnetic field, there has been known a TMR element (also referred to as an MTJ element) adapted to store information and to detect magnetism by using a TMR (tunnel magnetoresistance) effect. The use of the MTJ elements in MRAMs and the like has been expected in recent years.

Non Patent Document 1 discloses a perpendicular magnetization-type MTJ element. The perpendicular magnetization-type MTJ element includes a structure formed by stacking a free layer (a magnetization free layer), a tunnel barrier layer, and a reference layer (a magnetization fixed layer). Directions of magnetization of the free layer and the reference layer are made parallel to the stacking direction, respectively.

An increase in MR ratio (magnetoresistance ratio) is important for improving characteristics of an MRAM device using the magnetoresistive effect element. It is known that a stacking structure composed of CoFeB/MgO/CoFeB described in Non Patent Document 1 exhibits a high MR ratio above 100%.

CITATION LIST

Non Patent Document

Non Patent Document 1: D. C. Worledge et al., "Spin torque switching of perpendicular Ta|CoFeB|MgO-based magnetic tunnel junctions", Appl. Phys. Lett. 98, 2011, 022501

SUMMARY OF INVENTION

However, the MR ratio of the magnetoresistive effect element described in Non Patent Document 1 is still not high enough. While studies on further enhancement of the MR ratio by changing the structure of the magnetoresistive effect element are in progress on the one hand, there is also a demand on the other hand for enhancing the MR ratio by changing a manufacturing method instead of the structure.

The present invention has been made to solve the above-mentioned problem. An object of the present invention is to provide a manufacturing method of a magnetoresistive effect element having a higher MR ratio than that of a conventional magnetoresistive effect element.

A first aspect of the present invention is a manufacturing method of a magnetoresistive effect element comprising: a first step of forming a tunnel barrier layer on a substrate, on a surface of which one of a magnetization free layer and a magnetization fixed layer is formed; a second step of cooling the substrate after the first step; a third step of forming an other one of the magnetization free layer and the magnetization fixed layer on the tunnel barrier layer after the second step; and a fourth step of raising a temperature of the substrate after the third step.

According to the manufacturing method of a magnetoresistive effect element of the present invention, it is possible to realize the magnetoresistive effect element having a high MR ratio by performing the step of cooling the substrate after the step of forming the tunnel barrier layer and before the step of forming either the magnetization free layer or the magnetization fixed layer on the tunnel barrier layer. Moreover, according to the manufacturing method of a magnetoresistive effective element of the present invention, it is possible to prevent dew condensation on the substrate and thereby to improve yield by performing the step of raising the temperature of the substrate after the step of forming the tunnel barrier layer and after the step of forming either the magnetization free layer (a free layer) or the magnetization fixed layer (a reference layer) on the tunnel barrier layer.

BRIEF DESCRIPTION OF DRAWINGS

FIG. 9 is a schematic diagram showing an element configuration to be manufactured by a film formation method according to an embodiment of the present invention.

FIG. 10 is a diagram showing a flowchart of the film formation method according to the embodiment of the present invention.

DESCRIPTION OF EMBODIMENTS

Figure 1:
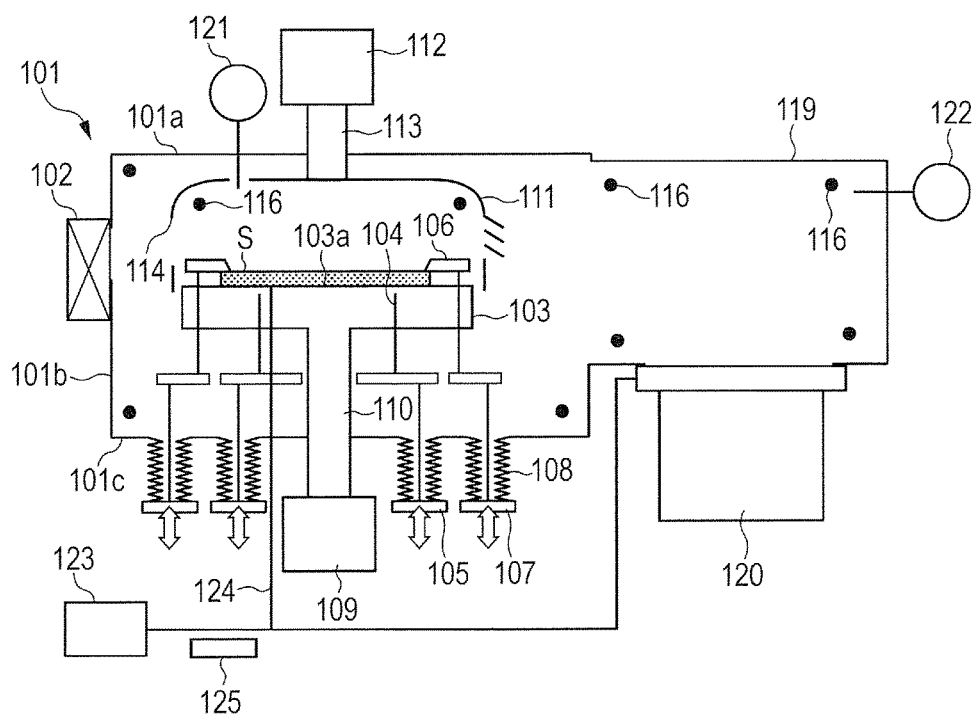
FIG. 1 is a schematic configuration diagram showing a substrate cooling device according to an embodiment of the present invention.

Embodiments of the present invention will be described below with reference to the drawings. It is to be noted, however, that the present invention is not limited only to these embodiments. In the drawings to be described below, constituents having the same functions are denoted by the same reference numerals and duplicate explanation thereof may be omitted as appropriate.

First Embodiment

FIG. 1 is a schematic configuration diagram showing a substrate cooling device 100 of this embodiment, which serves as a substrate processing device configured to cool a substrate. The substrate cooling device 100 includes a chamber 101 and an exhaust chamber 119. An upper wall 101a of the chamber 101 is detachably provided, so that maintenance work, cleaning, and the like can be performed while detaching the upper wall 101a. A gate valve 102 is openably and closably provided to a side wall 101b of the chamber 101, so that a substrate S can be conveyed into and out of the chamber 101 through the gate valve 102. A substrate holder 103 having a substrate mounting surface 103a is provided inside the chamber 101. The substrate S can be mounted on the substrate mounting surface 103a.

The substrate holder 103 is provided with a rod-like lift pin 104 for supporting a bottom surface of the substrate S while penetrating the substrate mounting surface 103a. By using a lift pin drive mechanism 105, the lift pin 104 can be elevated or lowered along a normal direction of the substrate S or the substrate mounting surface 103a. In addition, the substrate holder 103 is provided with a mechanical chuck 106 for fixing an outer peripheral portion of a top surface of the substrate S. By using a mechanical chuck drive mechanism 107, the mechanical chuck 106 can be elevated and lowered along the normal direction of the substrate S or the substrate mounting surface 103a. Each of the lift pin drive mechanism 105 and the mechanical chuck drive mechanism 107 is arbitrary driving means such as a motor and an actuator. Expandable bellows 108 are provided between the lift pin 104 and the lift pin drive mechanism 105, and between the mechanical chuck 106 and the mechanical chuck drive mechanism 107, so that the lift pin 104 and the mechanical chuck 106 can move while maintaining a hermetically sealed state of the chamber 101.

In order to fix the substrate S, an electrostatic adsorption mechanism (ESC) configured to fix the substrate S to the substrate holder 103 by using an electrostatic force may be provided instead of the mechanical chuck 106 and the mechanical chuck drive mechanism 107.

A substrate holder cooling unit 109 (substrate holder cooling means) provided outside the chamber 101 is connected to the substrate holder 103 via a substrate holder support column 110 that penetrates a lower wall 101c of the chamber 101. The substrate S mounted on the substrate mounting surface 103a can be cooled by maintaining the substrate holder 103 at a low temperature by using the substrate holder cooling unit 109. The substrate holder cooling unit 109 includes a not-illustrated temperature measurement unit (such as a thermocouple) for measuring the temperature of the substrate holder 103. The substrate holder 103 and the substrate holder support column 110 are preferably formed by using highly heat conductive metal such as copper and aluminum.

A shield 111 is provided inside the chamber 101. The shield 111 is provided to surround a lateral side of the substrate holder 103 and to cover an upper side of the substrate holder 103. In other words, the shield 111 is provided to surround a lateral side of the substrate mounting surface 103a and to be opposed to the substrate mounting surface 103a.

A shield cooling unit 112 provided outside the chamber 101 is connected to the shield 111 via a shield support column 113 that penetrates the upper wall 101a of the chamber 101. The shield 111 is maintained at a low temperature by using the shield cooling unit 112. Accordingly, when gas molecules that are released from the substrate holder 103 in the course of conveying the substrate S reach a surface of the shield 111, it is possible to trap the gas molecules on the surface. The shield cooling unit 112 includes a not-illustrated temperature measurement unit (such as a thermocouple) for measuring the temperature of the shield 111. The shield 111 and the shield support column 113 are preferably formed by using highly heat conductive metal such as copper and aluminum.

Each of the substrate holder cooling unit 109 and the shield cooling unit 112 (shield cooling means) is cooling means for performing the cooling in accordance with an arbitrary method, which may be a cooling device (such as a Gifford-McMahon refrigerator and a Stirling refrigerator) that performs cooling by use of adiabatic expansion of helium, or a device configured to perform cooling by feeding a refrigerant such as low-temperature liquid nitrogen supplied from outside as a refrigerant therein. In this embodiment, the substrate holder cooling unit 109 and the shield cooling unit 112 are provided as separate members. Instead, these cooling units may be provided collectively as a single cooling unit. An opening 114 for allowing passage of the substrate S is provided on a side surface of the shield 111 at a portion opposed to the gate valve 102. The gas adhering to the shield 111 can be removed by heating with heaters 116 provided at locations in the chamber 101 and the exhaust chamber 119, respectively.

The exhaust chamber 119 is connected to the chamber 101 such that internal spaces thereof can communicate with each other. The exhaust chamber 119 is provided with an exhaust pump 120 as an exhaust unit which can evacuate the inside of the chamber 101. Arbitrary exhaust means such as a dry pump and a turbomolecular pump can be used as the exhaust pump 120 depending on the required degree of vacuum. These pumps may also be used in combination. Moreover, an in-shield vacuum gauge 121 for measuring a pressure inside the shield 111, i.e., in a space defined by the shield 111 is provided to the chamber 101, while an in-chamber vacuum gauge 122 for measuring a pressure inside the exhaust chamber 119 is provided to the exhaust chamber 119.

Furthermore, in order to cool the substrate S efficiently, the substrate cooling device 100 is provided with a cooling gas introduction unit 123 for introducing a cooling gas between the bottom surface of the substrate S and the substrate mounting surface 103a. The cooling gas introduction unit 123 is connected to a gas line 124 which is a pipe for allowing passage of the cooling gas. The gas line 124 penetrates the chamber 101 and the substrate holder 103, and opens to a space between the bottom surface of the substrate S and the substrate mounting surface 103a. As for the cooling gas to be introduced from the cooling gas introduction unit 123, He, Ar, and a mixed gas containing at least one of the above substances can be used. The substrate S can be cooled quickly and homogeneously as a consequence of spreading the cooling gas over the bottom surface of the substrate S. The gas line 124 is also connected to the exhaust pump 120, so that the used cooling gas can be discharged by driving the exhaust pump 120. The gas line 124 includes a not-illustrated variable valve with which a route and a flow rate can be changed.

Although FIG. 1 illustrates only one system of the gas line 124, two systems of gas lines, namely, a gas line for introducing the cooling gas from the cooling gas introduction unit 123 and a gas line for discharging the cooling gas may be separately provided. The cooling gas introduction unit 123 preferably includes gas flow rate adjusting means such as a mass flow controller (MFC) and an automatic pressure controller (APC). Note that the cooling gas introduction unit 123 does not always have to be provided. As a matter of course, the substrate S can also be cooled by mounting the substrate S directly on the cooled substrate mounting surface 103a without using the coolant gas described above.

A gas line heater 125 is provided in the vicinity of the gas line 124. By heating the gas line 124 with the gas line heater 125, the gas molecules adsorbed onto an inner surface of the gas line can be efficiently removed. In FIG. 1, the gas line heater 125 is provided only at a certain part of the gas line 124. Instead, the gas line heater 125 may be provided at the entire gas line 124. While arbitrary heating means is applicable to the gas line heater 125, it is possible to use a ribbon heater, for example.

Figure 2:
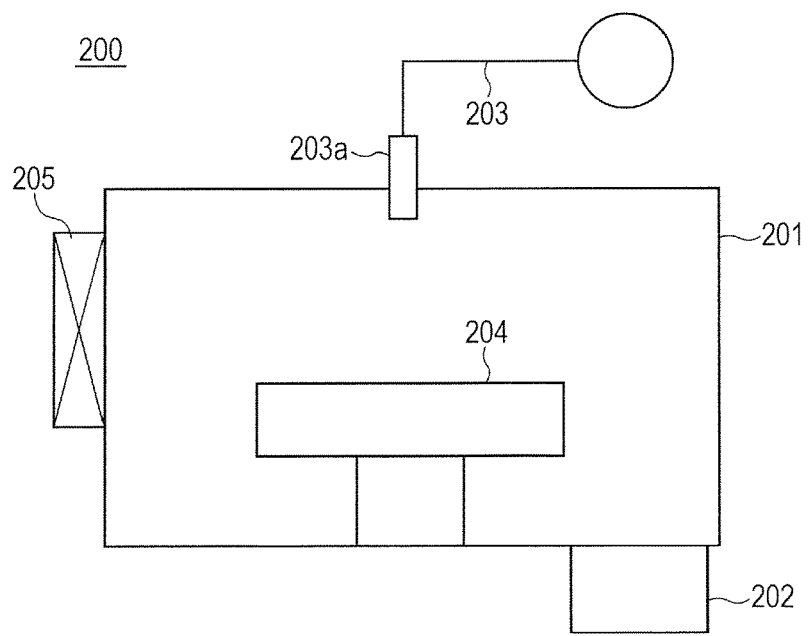
FIG. 2 is a schematic configuration diagram showing a temperature raising device according to the embodiment of the present invention.

FIG. 2 is a schematic configuration diagram showing a temperature raising device 200 of this embodiment, which serves as a substrate processing device configured to raise a temperature of a substrate. The temperature raising device 200 is a device which performs temperature raising processing on the substrate, and includes a chamber 201, an exhaust device 202, a gas supply device 203, and a substrate holder 204. The temperature raising device 200 is coupled to a conveyance chamber 3 to be described later via a gate valve 205. The gas supply device 203 is composed, for example, of a gas flow path coupled to a gas cylinder, a gas supply port 203a which supplies a gas into the chamber 201, and a not-illustrated mass flow controller (MFC). In the state where the substrate is mounted on the substrate holder 204, the temperature of the substrate can be raised by introducing a temperature raising gas from the gas supply port 203a. At this time, the temperature of the temperature raising gas to be introduced from the gas supply device 203 is preferably adjusted in advance. The temperature of the gas to be adjusted in advance is preferably a temperature equal to or above a temperature (a dew-point temperature) at which moisture does not cause dew condensation. As for a temperature width, it is preferable to set a range from 283 K to 343 K. The temperature of the gas in this embodiment is set to a room temperature (around 293 K). A gas with low moisture is suitable for use as the temperature raising gas, and examples of which include nitrogen gas, dry air, argon gas, and helium gas.

After the temperature raising of the substrate is completed, the gas inside the chamber 201 is evacuated with the exhaust device 202. Then, the substrate is conveyed by a conveyance device 7 (a conveyance robot) provided to the conveyance chamber 3 to a chamber for the next step. While the temperature raising device 200 is adapted to raise the temperature of the substrate by using the gas, the temperature raising device 200 may raise the temperature of the substrate by a lamp heater or heating a substrate holder instead. Though this embodiment applies the temperature raising device 200, any other method may be used instead as long as such a method is configured to be capable of raising the temperature of the substrate. For instance, a heater for raising the temperature of the substrate may be provided at any of conveyance paths so as to raise the temperature of the substrate in the course of conveyance by using the heater. Alternatively, a load-lock chamber may be used instead of the temperature raising device 200. When the temperature of the substrate is raised by using the load-lock chamber, the temperature of the substrate is raised with the introduced gas and then the substrate is conveyed into a chamber where film formation in subsequent steps takes place. The temperature raising processing herein is processing for raising the temperature of the substrate to the dew-point temperature or above. The temperature raising device 200 of this embodiment raises the temperature of the substrate to a room temperature (293 K).

Figure 3:
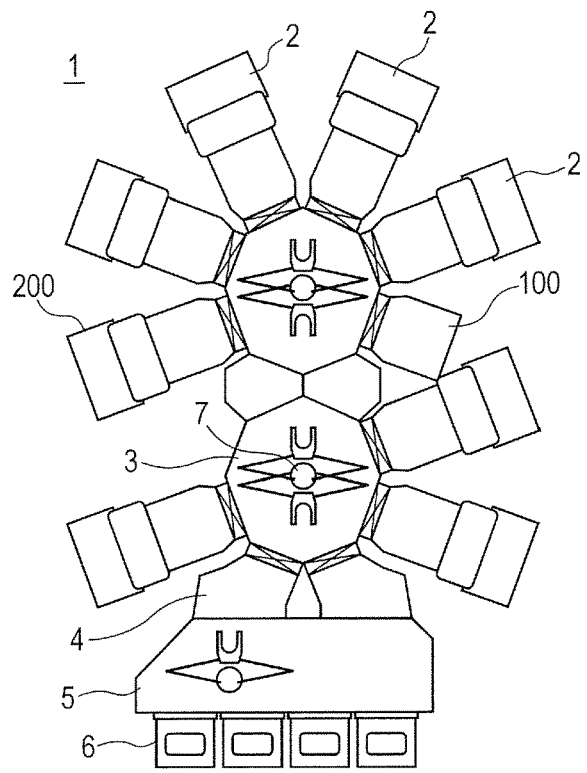
FIG. 3 is a schematic configuration diagram of a substrate processing system including the substrate cooling device according to the embodiment of the present invention.

FIG. 3 is a schematic configuration diagram of a substrate processing system 1 including the substrate cooling device 100 of this embodiment. The substrate processing system 1 is a cluster-type system which includes multiple substrate processing chambers 2 and a load-lock chamber 4 as well as the substrate cooling device 100 and the temperature raising device 200 of this embodiment. The multiple substrate processing chambers 2 may be configured to perform the same processing on the substrate S, or to perform different processing from one another.

The multiple substrate processing chambers 2, the load-lock chamber 4, the substrate cooling device 100, and the temperature raising device 200 are connected to one another via conveyance chambers 3, and openable and closable gate valves are provided at respective junctions. A conveyance robot 7 is installed in each conveyance chamber 3. By driving the conveyance robots 7, the substrate S is conveyed to and from the substrate processing chambers 2, the load-lock chamber 4, the substrate cooling device 100, and the temperature raising device 200 in accordance with predetermined processing order. Each of the substrate processing chambers 2, the conveyance chambers 3, the substrate cooling device 100, and the temperature raising device 200 is provided with an exhaust pump, so that the substrate S can be conveyed to and from these chambers while keeping the chambers in vacuum. An autoloader 5 for supplying the substrate S is provided outside the load-lock chamber 4. The autoloader 5 is configured to take substrates one by one out of external cassettes 6 located in an airy side and containing multiple substrates, and to put the substrates into the load-lock chamber 4.

Figure 4:
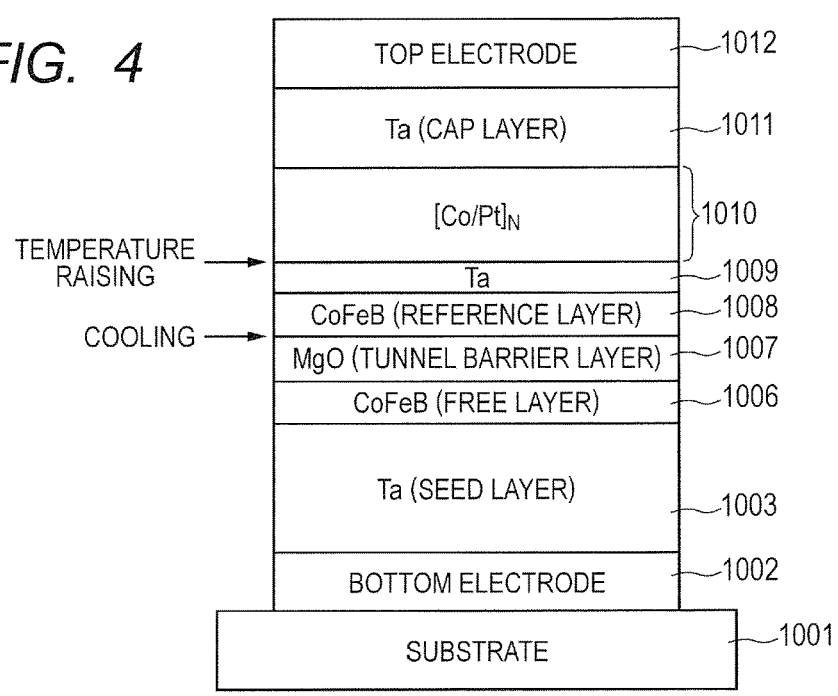
FIG. 4 is a schematic diagram showing an element configuration to be manufactured by a film formation method according to the embodiment of the present invention.

FIG. 4 is a schematic diagram showing a configuration of an exemplary MTJ (magnetic tunnel junction: a magnetoresistive effect element) element 1000 for which a film formation method of this embodiment is performed. The MTJ element is used in an MRAM (magnetic random access memory), a magnetic sensor, and the like.

The MTJ element 1000 is a perpendicular magnetization-type MTJ element (a p-MTJ element). The MTJ element 1000 includes a substrate 1001, and moreover, a bottom electrode 1002, a Ta layer (a seed layer) 1003, a CoFeB layer 1006 as a free layer (a magnetization free layer), and a MgO layer (a tunnel barrier layer) 1007 are provided thereon in this order. Provided further in the order listed below on this MTJ element 1000 are: a CoFeB layer 1008 as a reference layer (a magnetization fixed layer), a Ta layer 1009, a laminated body 1010, a Ta layer (a cap layer) 1011, and a top electrode 1012. The laminated body 1010 (a pin layer) of the MTJ element 1000 is formed by alternately laminating a predetermined number N of Co layers and Pt layers, respectively.

The MTJ element 1000 is not limited to the above-described configuration. It is possible to use a configuration subjected to arbitrary changes including, an increase or decrease in the layers, changes in materials constituting the layers, vertical inversion of the stacking order of the layers, and the like within a scope that does not impair functions of the perpendicular magnetization-type element. For instance, a configuration of an MTJ element 2000 obtained by vertically inverting the stacking order of the layers of the above-described MTJ element 1000 may be used as in a second embodiment to be described later with reference to FIG. 9.

The cooling processing by using the substrate cooling device 100 of this embodiment is preferably conducted after the tunnel barrier layer (the MgO layer) 1007 is formed on the free layer (the CoFeB layer) 1006 and before the CoFeB layer 1008 of the reference layer is formed on the tunnel barrier layer (the MgO layer) 1007. By performing the cooling processing at this timing by use of the substrate cooling device 100, it is possible to improve steepness of an interface between the tunnel barrier layer 1007 and the CoFeB layer 1008 of the reference layer by the cooling, and to suppress contamination of a top surface of the tunnel barrier layer 1007 (i.e., the interface between the tunnel barrier layer 1007 and the CoFeB layer 1008) during the cooling.

The cooling processing by use of the substrate cooling device 100 may be performed at a different timing. For example, an improvement in the MR ratio can be expected even by the performance after the formation of the Ta layer 1003 or after the formation of the CoFeB layer 1006 as the free layer (the magnetization free layer), because the cooling processing is effective if the processing brings about the cooled state of the substrate at the time of the formation of the CoFeB layer 1008 of the reference layer. In the meantime, the cooling processing may be performed at multiple timings out of the aforementioned timings.

The temperature raising processing by use of the temperature raising device 200 of this embodiment is preferably conducted after the orientation separating layer (the Ta layer) 1009 is formed on the CoFeB layer 1008 of the reference layer and before the laminated body 1010 is formed on the orientation separating layer (the Ta layer) 1009. By performing the temperature raising processing at this timing by use of the temperature raising device 200, it is possible to improve a magnetic characteristic of the laminated body 1010 by heating. Moreover, since the substrate is heated to the dew-point temperature or above by the temperature raising processing, it is possible to suppress dew condensation on the substrate when the substrate is taken out of the substrate processing system 1.

Note that the temperature raising processing may be conducted at an arbitrary timing after the CoFeB layer 1008 of the reference layer is formed and before the laminated body 1010 is formed. For example, the temperature raising processing may be conducted after the formation of the CoFeB layer 1008 of the reference layer and before the formation of the orientation separating layer (the Ta layer) 1009. Here, the laminated body 1010 represents a layer having perpendicular magnetic anisotropy (PMA), which is equivalent to susceptibility to magnetization in one direction (a direction perpendicular to a film surface), and is also referred to as a pin layer or a PMA layer. As the perpendicular magnetic anisotropy of the laminated body 1010 is greater, it is possible to suppress deterioration in resistance to thermal disturbance of the reference layer more efficiently, and thus to prevent occurrence of unintended magnetization reversal of the reference layer.

Figure 5:
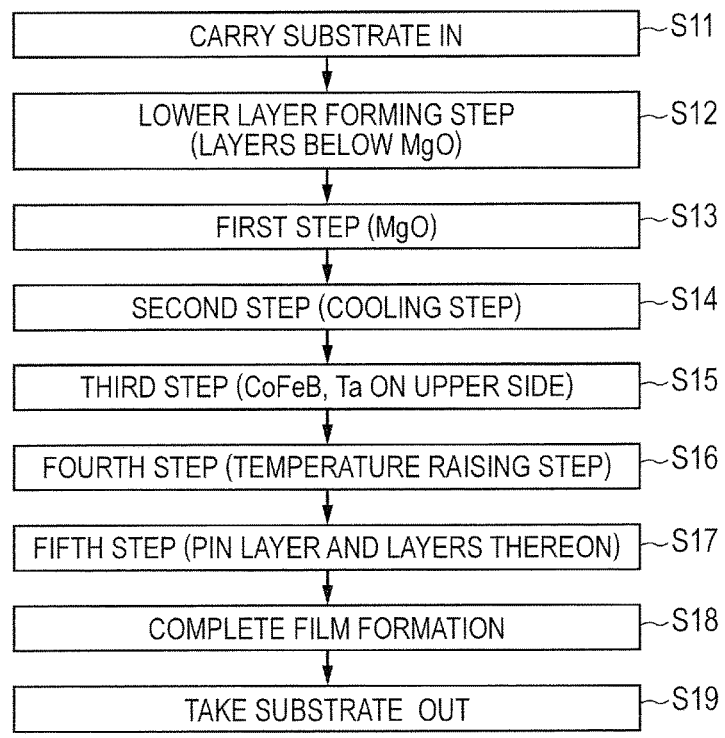
FIG. 5 is a diagram showing a flowchart of the film formation method according to the embodiment of the present invention.

FIG. 5 is a diagram showing a flowchart of the film formation method of this embodiment. Here, the film formation method of this embodiment will be described by using the substrate processing system 1 of a cluster type shown in FIG. 3. However, the present invention is not limited to this configuration. For example, a substrate processing system of an in-line type may be used instead. In the meantime, although the substrate cooling device 100 shown in FIG. 1 is used as the substrate cooling device included in the substrate processing system 1 in this embodiment, any other arbitrary substrate cooling device may be used instead. Similarly, a different device may be used instead of the temperature raising device 200.

First, the substrate S is carried into the load-lock chamber 4 of the substrate processing system 1 (step S11). Next, the substrate S is moved into a given one of the substrate processing chambers 2 by driving the conveyance robot 7 of the conveyance chamber 3, and then a lower layer forming step is performed (step S12). In the lower layer forming step, an impurity and the like adhering onto the substrate are removed by etching, and then the layers of the MTJ element 1000 below the MgO layer 1007, namely, the bottom electrode 1002, the Ta layer 1003, and the CoFeB layer 1006 as the free layer are formed in this order on the substrate 1001 by sputtering.

Next, the substrate S is moved into a given one of the substrate processing chambers 2 by driving the conveyance robot 7 of the conveyance chamber 3, and then a first step is performed (step S13). Of the MTJ element 1000, the MgO layer 1007 as the tunnel barrier layer is formed in the first step. The MgO layer 1007 is formed by radio frequency (RF) sputtering while using a MgO target. As an alternative method, the MgO layer 1007 may be produced by forming a Mg layer on the CoFeB layer 1006 as the free layer by sputtering while using a Mg target, and then subjecting the Mg layer to oxidation processing. The film formation processing and the oxidation processing may be carried out in the same substrate processing chamber 2 or carried out in different substrate processing chambers 2.

Next, the substrate S is moved into the substrate cooling device 100 by driving the conveyance robot 7 of the conveyance chamber 3, and then a second step (a cooling step) is performed (step S14). In the cooling step, the substrate S provided with the MgO layer 1007 is cooled to a temperature equal to or below 200 K (which is 100 K in this embodiment). By cooling the substrate S to the temperature equal to or below 200 K, an amorphous phase can be formed easily in the CoFeB layer 1008 as the reference layer to be formed layer.

In the cooling step, the cooling processing is performed by using the substrate cooling device 100. Thus, it is possible to achieve additional effects of quickly cooling the substrate S and reducing impurities in the film. The cooling step of this embodiment is not limited to the above-described configuration. Any arbitrary configuration of the cooling device and any arbitrary method of the cooling processing may be used as long as it is thereby possible to cool the substrate S provided with the MgO layer 1007 down to a predetermined temperature. Note that components of the CoFeB layer 1008 and the like thus formed can be analyzed by X-ray diffraction, for example.

Next, the substrate S is moved into a given one of the substrate processing chambers 2 by driving the conveyance robot 7 of the conveyance chamber 3, and then a third step is performed (step S15). Of the MTJ element 1000, the CoFeB layer 1008 as the reference layer, and the Ta layer 1009 on the CoFeB layer 1008 are formed in this order by sputtering.

Next, the substrate S is moved into the temperature raising device 200 by driving the conveyance robot 7 of the conveyance chamber 3, and then a fourth step (a temperature raising step) is performed (step S16). In the temperature raising step, the temperature of the substrate S provided with the layers up to the Ta layer 1009 is raised to a temperature (which is 293 K in this embodiment) equal to or above the dew-point temperature.

Next, the substrate S is moved into a given one of the substrate processing chambers 2 by driving the conveyance robot 7 of the conveyance chamber 3, and then a fifth step is performed (step S17). Of the MTJ element 1000, the laminated body 1010 and the layers located thereon, namely, the laminated body 1010 as the pin layer, the Ta layer 1011, and the top electrode 1012 are formed in this order by sputtering.

By raising the temperature of the substrate S to a room temperature, it is possible to improve the magnetic characteristic of the laminated body 1010 formed on the Ta layer 1009. The magnetic characteristic of the laminated body 1010 is the perpendicular magnetic anisotropy, which is equivalent to the susceptibility to magnetization in the one direction (the direction perpendicular to the film surface). A possible reason for the improvement in the magnetic characteristic of the laminated body 1010 as a consequence of the temperature raising is that Co atoms sputtered and adhering onto the substrate in the course of the formation of the laminated body 1010 are likely to migrate on a surface where the atoms adhere to. In other words, it is thought to be due to an improvement in positional relation of Pt and Co in the laminated body 1010 as a result of movement of Co particles on the surface. An effect of the improvement in the magnetic characteristic of the laminated body 1010 will be described later. Even when the laminated body adopts a film configuration not using the Co atoms, a similar effect is expected by applying the film formation method (a manufacturing method) of this embodiment as long as the laminated body includes atoms which are likely to migrate on a surface where the atoms adhere to.

Thereafter, annealing processing is performed at a predetermined temperature (from 150° C. to 400° C., for example), and the film formation is completed (step S18). The film formation processing and the annealing processing may be carried out in the same substrate processing chamber 2 or carried out in different substrate processing chambers 2. Lastly, the substrate S is moved to a conveyance position (a substrate takeout position) inside the load-lock chamber 4 by driving the conveyance robot 7 of the conveyance chamber 3 (step S19). Then, the substrate S is sent to a step downstream of the substrate processing system 1. Here, the annealing processing may be carried out with a different device from the substrate processing system 1. In this case, an annealing step is performed as a step downstream of the substrate processing system 1.

The layers formed in the film forming steps (steps S12, S13, S15, and S17) of this embodiment are formed by sputtering. Instead, the layers may be formed by other arbitrary film formation methods.

Of the multiple films formed in the film forming steps (steps S12, S13, S15, and S17), two or more films may be formed in the same substrate processing chamber 2 or all of the films may be formed in mutually different substrate processing chambers 2. At least one of the film forming steps (steps S12, S13, S15, and S17) and either the cooling step (step S14) or the temperature raising step (step S16) may be performed in the same chamber.

Figure 6:
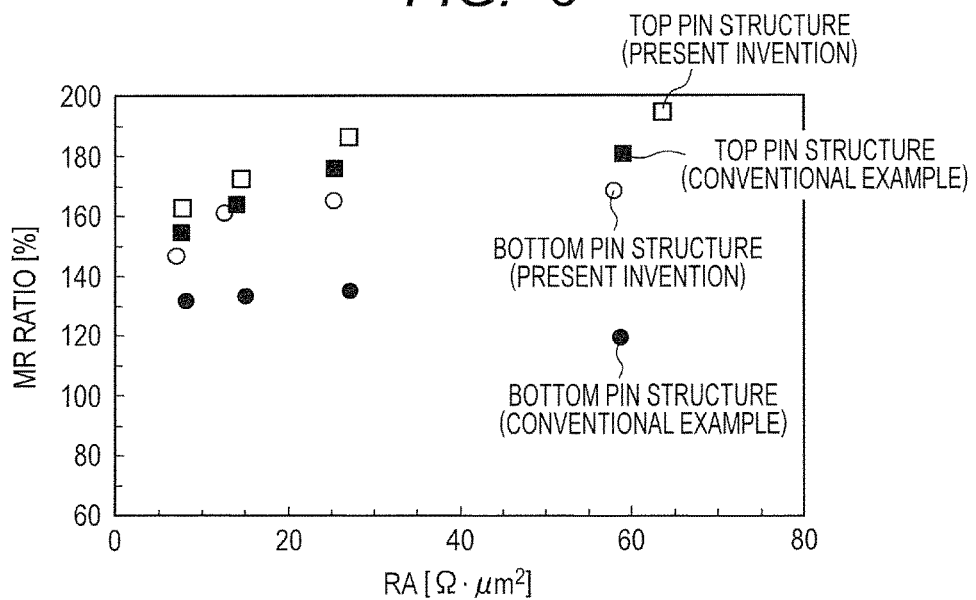
FIG. 6 is a diagram showing a graph of MR ratios of elements manufactured by the film formation method according to the embodiment of the present invention.

FIG. 6 is a diagram showing a graph of MR ratios relative to RA (areal resistances) of the MTJ elements manufactured by the film formation method of this embodiment. The MTJ elements manufactured by using the film formation method of this embodiment and MTJ elements manufactured by using a conventional manufacturing method were produced, respectively, and were subjected to measurements of the RA and the MR ratios. The conventional film formation method is a film formation method of manufacturing in accordance with the flowchart of FIG. 5 or a flowchart of FIG. 10 but without performing the cooling step (step S14 or S34) and the temperature raising step (step S16 or S36).

The horizontal axis of FIG. 6 indicates the RA ($\Omega \cdot \mu m^2$) while the vertical axis thereof indicates the MR ratio (%). An element characteristic of an MTJ element is deemed to be better as the RA is lower or the MR ratio is higher. In FIG. 6, filled squares (■) represent measurement results of an MTJ element of a top pin structure shown in FIG. 4, which is manufactured by the conventional film formation method. Meanwhile, open squares (□) represent measurement results of an MTJ element of the top pin structure, which is manufactured by the film formation method of this embodiment.

Meanwhile, open circles (○) and filled circles (●) in FIG. 6 represent measurement results of MTJ elements of a bottom pin structure. The filled circles (●) represent the measurement results of the MTJ element of the bottom pin structure, which is manufactured by the conventional film formation method. Meanwhile, the open circles (○) represent the measurement results of the MTJ element of the bottom pin structure, which is manufactured by a film formation method of a second embodiment to be described later. An MTJ element 2000 will be described later with reference to FIGS. 9 and 10.

According to FIG. 6, it is apparent that the MR ratio is improved by performing the film formation in accordance with the film formation method of this embodiment as compared to the case of not performing the cooling and temperature raising steps as in the conventional method. Meanwhile, the MR ratio relative to the RA (the areal resistance) was also measured regarding an MTJ element manufactured without performing the temperature raising step (step S16). Results of this MTJ element substantially overlapped the points of the open squares (□) in FIG. 6. In other words, it was made clear that the RA (areal resistance) and the MR ratio are significantly influenced by the cooling step (step S14) while the presence or absence of the temperature raising step (step S16) has only a small influence on the RA (areal resistance) and the MR ratio. As described above, it was confirmed that it was effective to conduct the cooling after the film formation of the MgO layer 1007 as the tunnel barrier layer and before the film formation of the CoFeB layer 1008 as the reference layer in order to manufacture the MTJ element 1000 having the favorable element characteristics.

Regarding the MTJ element of the bottom pin structure of the second embodiment, the RA and the MR ratio of the MTJ element not subjected to the temperature raising step (step S36) substantially overlapped the points of the open circles (○). In other words, regarding the MTJ element of the bottom pin structure as well, the RA (areal resistance) and the MR ratio are significantly influenced by the cooling step (step S34). It was confirmed that it was effective to conduct the cooling after film formation of a MgO layer 2008 as a tunnel barrier layer and before film formation of a CoFeB layer 2009 as a free layer in order to manufacture the MTJ element 2000 having the favorable element characteristics.

Figure 7:
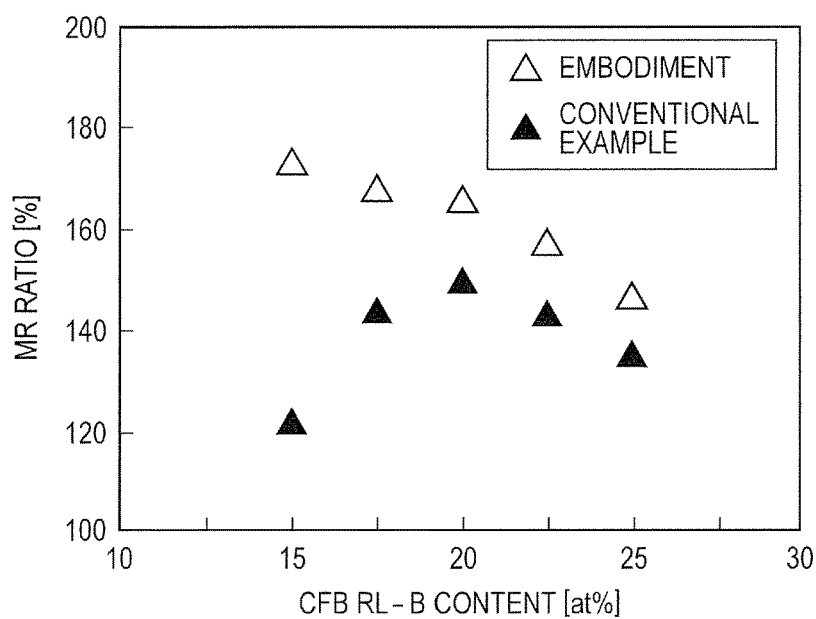
FIG. 7 is a diagram showing a graph of MR ratios of elements manufactured by the film formation method according to the embodiment of the present invention.

FIG. 7 is a diagram showing an effect of the cooling step in the film formation method of this embodiment, which is a diagram showing a graph of the MR ratio relative to B content (boron content) in the CoFeB layer as the reference layer in the MTJ element. Here, the MR ratios were measured while varying the B content in the CoFeB layer 1008 as the reference layer. The horizontal axis of FIG. 7 indicates the B content (at %) in the CoFeB layer as the reference layer 1008 and the vertical axis thereof indicates the MR ratio (%).

In FIG. 7, filled triangles (▲) represent measurement results of the MTJ element which underwent the film formation without being subjected to the cooling, and open triangles (△) represent measurement results of the MTJ element which underwent the film formation while being subjected to the cooling after the film formation of the MgO layer 1007 and before the film formation of the CoFeB layer 1008 as the reference layer. Each of the MTJ elements concerning the measurement results was manufactured in accordance with the flowchart of FIG. 5. However, the temperature raising step (step S16) was not performed in either case. The only difference between the MTJ element indicated with the filled triangles (▲) and the MTJ element indicated with the open triangles (△) is the presence or absence of the cooling step (step S14). Here, the presence or absence of the temperature raising step (step S16) does not have significantly influence on the MT ratios. Accordingly, the measurement results of the MTJ elements manufactured by the manufacturing method of this embodiment designed to perform the temperature raising step were substantially the same as the measurement results of the film formation method in FIG. 7 in which the cooling step was performed.

According to FIG. 7, it is apparent that the measurement result (the open triangle (△)) of the film formation method to perform the cooling step achieved the higher MR ratio than that of the measurement result (the filled triangle (▲)) in the conventional case of not performing the cooling at any value of the B content. In particular, it is desirable to set the B content in the CoFeB layer 1008 as the reference layer equal to or below 15 at %, because the MR ratio is significantly increased in this case as compared the case of not performing the cooling.

Meanwhile, as clear from the graph of FIG. 7, according to the measurement results (the filled triangles (▲)) in the conventional case of not performing the cooling, the maximum MR ratio is obtained when the B content is equal to about 20%. For this reason, it is a general practice in the conventional case to set the B content of the CoFeB layer to about 20% (such as Co:Fe:B=20:60:20). On the other hand, according to the measurement results (the open triangles (△)) of the film formation method to perform the cooling step, the MR ratio grew larger as the B content was lower. For this reason, according to the film formation method of this embodiment, it is possible to set the B content lower than that in the conventional case while maintaining the high MR ratio. Thus, the CoFeB layer 1008 as the reference layer has high flexibility of its composition.

It has been known that the MR ratio can be improved by providing the reference layer with the amorphous phase. However, in order to provide the conventional CoFeB layer with the amorphous phase, it was necessary to add a predetermined rate (about 20% as mentioned above) of B. On the other hand, the film formation method of this embodiment achieves the high MR ratio with the lower B content than that in the conventional case presumably because the amorphous phase is more likely to be formed in the reference layer as a consequence of performing the cooling after the film formation of the tunnel barrier layer and before the film formation of the reference layer.

In other words, by the cooling step in the film formation method of this embodiment, the reference layer is provided with the amorphous phase even at the low B content, whereby the high MR ratio is achieved. In the meantime, regarding the MTJ element of the bottom pin structure, it is also possible to manufacture the MTJ element 2000 having the high MR ratio by performing the cooling after the film formation of the MgO layer 2008 and before the film formation of the CoFeB layer 2009 as the free layer.

Figure 8:
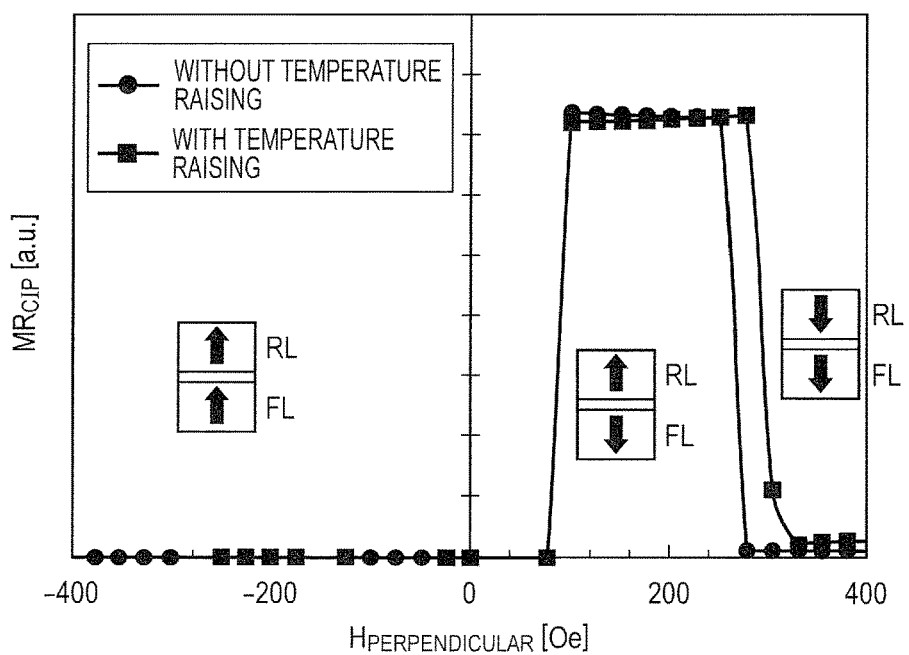
FIG. 8 is a diagram showing a magnetoresistance curve of the element manufactured by the film formation method according to the embodiment of the present invention.

FIG. 8 shows a magnetoresistance curve of the MTJ element manufactured by the film formation method of this embodiment. As for the MTJ elements subjected to measurement, two types of the MTJ elements were compared and measured, namely, an MTJ element (filled squares (■)) manufactured by the film formation method of this embodiment (in which the temperature raising step was performed), and an MTJ element (filled circles (●)) manufactured in accordance with the flowchart of FIG. 5 but without performing the temperature raising step. The horizontal axis indicates the orientation and strength of magnetic field intensity in the vertical direction, in which −400 (Oe) represents a magnetic field in a downward orientation (a direction of magnetization of the reference layer) having intensity of 400 (Oe), while 400 (Oe) represents a magnetic field in an upward orientation (an opposite direction to the direction of magnetization of the reference layer). The vertical axis indicates the resistance value. The resistance value on the vertical axis is a value proportional to the MR ratio.

Regarding the MTJ element (circular dots in FIG. 8) not subjected to the temperature raising step (step S16), magnetization of the free layer was reversed at 80 (Oe) and magnetization of the reference layer was reversed at 280 (Oe). On the other hand, regarding the MTJ element (square dots in FIG. 8) subjected to the temperature raising step (step S16), magnetization of the free layer was reversed at 80 (Oe) and magnetization of the reference layer was reversed at 320 (Oe). In other words, it is made clear that the reference layer of the MTJ element subjected to the temperature raising step has high resistance to the magnetic field and is less likely to cause the magnetization reversal.

According to the manufacturing method of this embodiment, it is possible to manufacture a magnetoresistive effect element having a higher MR ratio than that of a conventional element, avoiding deterioration in the perpendicular magnetic anisotropy of the reference layer, and being capable of suppressing deterioration in the MR ratio. Moreover, the magnetoresistive effect element manufactured by the manufacturing method of this embodiment has the higher MR ratio than that of the conventional element and is capable of suppressing deterioration in resistance to thermal disturbance of the reference layer. Thus, it is possible to prevent occurrence of unintended magnetization reversal of the reference layer during reading and writing.

Second Embodiment

While the MTJ element 1000 according to the first embodiment has the structure (the top pin structure) in which the reference layer 1008 is provided on the tunnel barrier layer 1007, the present invention is also applicable to the structure (the bottom pin structure) in which the free layer is provided on the tunnel barrier layer. FIG. 10 is a diagram showing a flowchart of a film formation method of the MTJ element 2000 shown in FIG. 9, which represents an example of the MTJ element of the bottom pin structure.

After a substrate is carried into a given substrate processing chamber (step S31), layers up to a CoFeB layer 2007 as a reference layer are formed in a lower layer forming step (step S32). Specifically, in the lower layer forming step (step S32) of the manufacturing process of the MTJ element 2000, a bottom electrode 2002, a Ta seed layer 2003, a Ru layer 2004, a laminated body 2005 (a pin layer), a Ta layer 2006, and the CoFeB layer 2007 as the reference layer are formed on the substrate 1001. As described above, in this embodiment, the laminated body (the pin layer) is formed prior to formation of the tunnel barrier layer (the MgO layer).

In a first step (step S33) subsequent to the lower layer forming step (step S32), the MgO layer 2008 as the tunnel barrier layer is formed on the CoFeB layer 2007 as the reference layer. Then, a second step (a cooling step: step S34) is performed and then the CoFeB layer 2009 as the free layer is formed on the MgO layer 2008 in a third step (step S35). A fourth step (a temperature raising step: step S36) is performed after the third step (step S35), and a Ta cap layer 2010 and a top electrode 2011 are formed on the CoFeB layer 2009 in a fifth step (step S37). Then, the film formation is completed (step S38) and the substrate is taken out (step S39).

The film formation method according to the present invention is applicable to both the top pin structure and the bottom pin structure, and is configured to form one of the free layer and the reference layer, to form the tunnel barrier layer on the one of the free layer and the reference layer, to perform the cooling, to form the other one of the free layer and the reference layer on the tunnel barrier layer, and further to perform the temperature raising.

According to the manufacturing method (the film formation method) of the present invention, it is possible to manufacture a magnetoresistive effect element having a higher MR ratio than that of a conventional element. Moreover, according to the manufacturing method of this embodiment, the temperature of the substrate after the temperature raising step exceeds the dew-point temperature, so that adhesion of moisture and the like can be suppressed. The dew-point temperature here means a temperature at which the moisture starts dew condensation. The moisture does not cause dew condensation on the substrate at the temperature above the dew-point temperature. In particular, since the substrate which is taken out of the substrate processing system 1 has the temperature exceeding the dew-point temperature, it is possible to suppress the dew condensation on the substrate when the substrate is taken out of the substrate processing system 1.

In addition, the magnetoresistive effect element of the top pin structure manufactured by the manufacturing method of the present invention has a higher MR ratio than that of a conventional element, and is capable of suppressing deterioration in resistance to thermal disturbance of the reference layer. Thus, it is possible to prevent occurrence of unintended magnetization reversal of the reference layer during reading and writing.

The present invention is not limited to the above-described embodiments but can be modified as appropriate within the range not departing from the gist of the present invention. Although the above-described embodiments have been explained as being applicable to the manufacture of the MTJ element (the TMR element) used in a MRAM, the same cooling method, temperature raising method, and film formation method are applicable to the manufacture of other MTJ elements.

The embodiments have been described above on the assumption that the direction of the gravity represents the vertical direction. However, the directions to configure the device are arbitrary. When the substrate cooling device according to each of the above-described embodiments is installed by tilting the device at 90° (i.e., when the top surface of the substrate S is fixed in alignment with the direction of the gravity), the vertical direction in each of the above-described embodiments should be read as a direction perpendicular to the direction of the gravity.

The invention claimed is:

1. A manufacturing method of a magnetoresistive effect element comprising:
    a first step of forming a tunnel barrier layer on a substrate, on a surface of which a magnetization free layer is formed;
    a second step of cooling the substrate after the first step;
    a third step of forming a magnetization fixed layer on the tunnel barrier layer after the second step;
    a fourth step of raising a temperature of the substrate after the third step to a temperature that is higher than a dew-point temperature and is lower than a crystallization temperature of the magnetization fixed layer;
    a fifth step of forming a pin layer after the fourth step;
    a sixth step of forming a top electrode after the fifth step; and
    a seventh step of raising the temperature of the substrate after the sixth step, to a temperature equal to or higher than the crystallization temperature.

2. The manufacturing method according to claim 1, further comprising, after the third step and before the fourth step, a step of forming an orientation separating layer.

* * * * *